(12) United States Patent
Huang et al.

(10) Patent No.: US 10,393,841 B2
(45) Date of Patent: Aug. 27, 2019

(54) MAGNETIC RESONANCE COIL SELECTION METHOD AND COMPUTER

(71) Applicant: Siemens Healthcare GmbH, Erlangen (DE)

(72) Inventors: Yan Tu Huang, Shenzhen (CN); Zhi Guo Sun, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 69 days.

(21) Appl. No.: 15/611,994

(22) Filed: Jun. 2, 2017

(65) Prior Publication Data

US 2017/0350953 A1 Dec. 7, 2017

(30) Foreign Application Priority Data

Jun. 3, 2016 (CN) .......................... 2016 1 0392098

(51) Int. Cl.
*G01R 33/54* (2006.01)
*G01R 33/36* (2006.01)
*G01R 33/3415* (2006.01)

(52) U.S. Cl.
CPC ....... *G01R 33/543* (2013.01); *G01R 33/3664* (2013.01); *G01R 33/3415* (2013.01)

(58) Field of Classification Search
CPC . G01R 33/3664; G01R 33/546; G01R 33/543
USPC ......................................................... 324/309
See application file for complete search history.

(56) References Cited

U.S. PATENT DOCUMENTS

| 5,138,260 | A | * | 8/1992 | Molyneaux | G01R 33/3415 324/309 |
| 5,216,367 | A | * | 6/1993 | Mori | G01R 33/3415 324/318 |
| 5,666,055 | A | * | 9/1997 | Jones | G01R 33/3415 324/318 |
| 6,326,786 | B1 | * | 12/2001 | Pruessmann | G01R 33/5611 324/312 |
| 7,259,559 | B2 | * | 8/2007 | Nabetani | G01R 33/3415 324/307 |
| 7,352,182 | B1 | * | 4/2008 | Steckner | G01R 33/3415 324/307 |
| 2002/0125888 | A1 | * | 9/2002 | Visser | G01R 33/3415 324/318 |
| 2005/0275402 | A1 | | 12/2005 | Campagna | |
| 2007/0210793 | A1 | | 9/2007 | Kiefer | |
| 2008/0211502 | A1 | | 9/2008 | Arnold et al. | |
| 2008/0303519 | A1 | * | 12/2008 | Van Den Brink | G01R 33/3415 324/307 |
| 2009/0234218 | A1 | * | 9/2009 | Washburn | A61B 5/055 600/410 |

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

In a magnetic resonance coil selection method and selection computer, a range parameter of a target region (ROI) to be detected is acquired, and a detection range parameter of each available coil is acquired. A coil having a detection range that overlaps with a range of the ROI is determined and then selected. The selected coil is then used in the operation of a magnetic resonance scanner to acquire magnetic resonance data. The SNR of the magnetic resonance scanner is thereby increased, so as to improve the imaging quality.

14 Claims, 5 Drawing Sheets

(56) References Cited

U.S. PATENT DOCUMENTS

| | | | |
|---|---|---|---|
| 2010/0060284 A1* | 3/2010 | Sugiura | G01R 33/3664 324/318 |
| 2010/0259262 A1* | 10/2010 | Ichinose | G01R 33/3415 324/309 |
| 2010/0260399 A1* | 10/2010 | Hajnal | G06F 19/321 382/131 |
| 2010/0264923 A1* | 10/2010 | Heberlein | G01R 33/5611 324/309 |
| 2011/0169489 A1* | 7/2011 | Leussler | G01R 33/288 324/307 |
| 2013/0187651 A1* | 7/2013 | Konta | G01R 33/5611 324/309 |
| 2014/0002083 A1 | 1/2014 | Asaba et al. | |
| 2014/0132266 A1* | 5/2014 | Soejima | A61B 5/055 324/314 |
| 2014/0195954 A1* | 7/2014 | Doshi | G06F 19/321 715/771 |
| 2015/0177340 A1* | 6/2015 | Mori | G01R 33/3664 324/321 |
| 2015/0327949 A1* | 11/2015 | Van De Wardt | A61N 5/1007 600/417 |
| 2015/0338484 A1* | 11/2015 | Hoff | G01R 33/341 324/307 |
| 2015/0369897 A1* | 12/2015 | Keil | G01R 33/546 324/309 |

* cited by examiner

MAGNETIC RESONANCE COIL SELECTION METHOD AND COMPUTER

BACKGROUND OF THE INVENTION

Field of the Invention

The present invention relates to the field of magnetic resonance data acquisition, in particular to a magnetic resonance coil selection method and computer in order to select a coil to be used for such magnetic resonance data acquisition.

Description of the Prior Art

During a magnetic resonance (MR) examination, local coils are used to receive radio frequency (RF) signals from an object being examined in an MR scanner. There may be many local coils available for use in the MR scanner, but only a subset of these is selected to receive signals so as to achieve a better signal-to-noise ratio (SNR). The selection operation may be implemented by an operator or by a computer. If the local coils are not selected correctly, this will result in a poor SNR.

Many technical solutions are known in order to select MR coils in MR systems to perform MR imaging.

For example, in United States Patent Application Publication No. 2005/0275402, a method for emitting an RF signal and acquiring spatially distributed data is disclosed, the data representing a signal intensity distribution using a valid coil. Based on the data, a 3D exposure curve is automatically determined for each coil. One coil may be selected from the multiple coils, and used to acquire MR image data from a target region of an examination object.

As another example described in United States Patent Application Publication No. 2007/0210793, wherein a magnetic resonance imaging (MRI) method is disclosed that includes selecting a coil on the basis of the result of pre-evaluation of MR signal intensity, receiving signals from the coil selected, and performing MRU on the basis of these signals.

Another example is described in United States Patent Application Publication No. 2008/0211502, wherein a method is disclosed that includes using a multi-coil apparatus to generate a magnetic field change region at an MR excitation core, for the purpose of receiving a region triggered at a core moment. A coil position of the multi-coil apparatus is determined by an installation apparatus. Also included are multiple coil sets, each coil set comprising a coil apparatus; during target detection, a control operation of one of the multiple coil sets is determined by a position of the installation apparatus.

United States Patent Application Publication No. 2014/0002083 discloses a method for selecting an RF coil from an RF coil set according to a ranking of respective correlation, between each coil and another coil. Based on this ranking result, a priority ranking of the RF coil set is determined, and a subset of the RF coil set as selected by the priority ranking of the RF coils, the subset including a number of RF coils. An image generator generates a composite magnetic resonance (MR) image on the basis of an image data set of the RF coil subset selected (not including an image data set provided by a remaining RF coil).

Such conventional MR coil selection methods primarily select coils on the basis of the field of view (FOV) of the scanner. Such methods of coil selection have the following shortcomings.

When only a specific part of the body is examined, such as the heart or the prostate, the FOV is generally larger than the target region (ROI, such as the heart and prostate). In these situations, the FOV cannot be reduced, otherwise a foldover artifact will result. Because of the conventional method of automatically selecting coils based on the FOV, a larger number of coils than is actually needed will be selected, and this results in a reduced SNR.

As an example, FIG. 1 schematically illustrates automatic selection of coils in the prior art. Bo1, Bo2, Bo3 and Bo4 are body coil element sets; Sp1, Sp2, Sp3 and Sp4 are spine coil element sets. Each coil element set may include more than one coil element. For example, coil element set Bo1 has four coil elements, for example B11, B12, B13 and B14 (not shown in the figure). Coil element sets Bo2, Bo3, Bo4, Sp1, Sp2, Sp3 and Sp4 also have similar configurations. In FIG. 1, the body coil element sets are located above the patient's body; the spine coil element sets are located below the patient's body. However, for clarity of presentation, FIG. 1 is a view with the body coil element sets shown on the left side (indicating the region above the patient's body), while the spine coil element sets are shown on the right side (indicating the region below the patient's body). Referring to FIG. 1, in the prior art, coils are selected automatically based on FOV 101; not only are coil element sets Bo1, Bo2, Sp1 and Sp2 selected, but also coil element sets Bo3 and Sp3 are selected. However, as FIG. 1 shows, the contribution made by Bo3 and Sp3 to the detection of the target region, i.e. the heart 102, is not large. If the FOV 101 were limited to only the heart and prostate regions, this would result in a foldover artifact. If the FOV 101 were too large, then unnecessary coils would be selected by the system, and the SNR for the heart and prostate would be less than the optimal SNR. Therefore, this selection method in the prior art would select a larger number of coils than actually required, resulting in a reduced SNR, and ultimately resulting in a reduction in MRI quality.

SUMMARY OF THE INVENTION

An object of the present invention is to provide an MR coil selection method that increases the SNR of an MR system, and improves imaging quality.

Another object of the present invention is to provide an MR coil selection computer, which can increase the SNR of an MR system, and improve imaging quality.

An MR coil selection method in accordance with the invention has the following steps, performed by a computer.

A range parameter of a target region ROI to be detected is determined, and a detection range parameter of each available coil is acquired.

A coil having a detection range overlaps with a range of the ROI is determined, and then selected is used in operating an MR scanner in order to acquire MR data.

In a preferred embodiment of the invention, the step of acquiring a range parameter of an ROI includes displaying an image of an object to be detected on a user interface of an MR system, receiving a range selection instruction entered via an input device, determining a relative position range, in the image of the object to be detected, of the range selection instruction, and using a parameter of the range as the aforementioned a range parameter of the ROI.

In another embodiment, a graphical identification algorithm is executed in the computer so as to identify the shape of a part to be detected, and a bounding box is generated according to the identified shape, and a parameter of the bounding box used as the range parameter of the ROI.

In a preferred embodiment of the invention, the step of acquiring a detection range parameter of each coil includes acquiring the detection range from a configuration file of coils of the MR system.

In a preferred embodiment of the invention, the step of determining a coil having a detection range that overlaps with a range of the ROI includes determining, in sequence, whether a detection range of each coil overlaps with the range of the ROI according to any one of the following three forms.

First Form:

Taking a detection range of the coil to be an oriented bounding box OBB, taking the range of the ROI to be an OBB, each OBB having 3 independent faces, and 3 independent edge directions;

with regard to the two OBBs, performing the following detection:

A: detecting whether a first separating axis exists, which separating axis is orthogonal to 3 independent faces of one of the two OBBs;

B: detecting whether a second separating axis exists, which separating axis is orthogonal to 3 independent faces of the other of the two OBBs;

C: combining the total 6 independent edge directions of the two OBBs in pairs, to form 9 edge pair sets, and detecting whether a third separating axis exists, which third separating axis is orthogonal to the 9 edge pair sets;

If the detections A, B and C all hold true, then the two OBBs do not overlap, otherwise the two OBBs overlap.

Second Form:

Taking the range of the ROI and the detection range of the coil element to be AABBs (axis-aligned bounding boxes) respectively, the two AABBs being represented by R and S respectively, then:

If (RminX<=SmaxX^RmaxX>=SminX)^
(RminY<=SmaxY^RmaxY>=SminY)A
(RminZ<=SmaxZ^RmaxZ>=SminZ) holds true,
then R and S overlap;

wherein RminX represents the minimum value of R in the X direction, RmaxX represents the maximum value of R in the X direction, RminY represents the minimum value of R in the Y direction, RmaxY represents the maximum value of R in the Y direction, RminZ represents the minimum value of R in the Z direction, RmaxZ represents the maximum value of R in the Z direction, SminX represents the minimum value of S in the X direction, SmaxX represents the maximum value of S in the X direction, SminY represents the minimum value of S in the Y direction, SmaxY represents the maximum value of S in the Y direction, SminZ represents the minimum value of S in the Z direction, SmaxZ represents the maximum value of S in the Z direction, and A represents an AND relationship.

Third Form:

Taking a detection range of the coil element to be a sphere Q, taking the range of the ROI to be an AABB (P), obtaining a point on the AABB (P) that is closest to the center of the sphere Q, calculating the distance from this point to the center of the sphere Q, and if the distance is smaller than the sphere radius of the sphere Q, then Q and P overlap.

In a preferred embodiment of the present invention, the coil is a coil element set, the detection range of the coil is the sum of detection ranges of all coil elements in the coil element set, and the step of selecting the coil having a detection range that overlaps with the ROI includes selecting all coil elements in the coil element set having a detection range that overlaps with the range of the ROI.

In a preferred embodiment of the present invention, the coil is a coil element, the detection range of the coil is the detection range of the coil element, and the step of selecting the coil having a detection range that overlaps with the ROI includes, in a coil element set whose detection range overlaps with the range of the ROI, selecting only the coil element having a detection range that overlaps with the range of the ROI.

An MR coil selection computer in accordance with the invention has an input interface that receives an input that designates a range parameter of an ROI to be detected, as well as further inputs that respectively designate a detection range parameter of each coil. From these inputs, a processor of the computer is configured to determine a coil having a detection range that overlaps with a range of the ROI. The processor is further configured to then select a coil having the aforementioned detection range that overlaps with the range of the ROI, for use by an MR scanner in executing a data acquisition sequence in order to acquire MR data.

In an embodiment, an image of the object to be detected is displayed at a user interface of the MR system, and the input interface of the selection computer receives a range selection instruction that is entered by a user dependent on the displayed image. The processor determines a relative position range in the image of the object to be detected based in the selection instruction, and uses a parameter of that range as the range parameter of the ROI. Alternatively, a graphical identification algorithm can be executed in the processor in order to identify the shape of the object to be detected, and a bounding box is generated by the processor according to the identified shape. A parameter of the bounding box is then used as the aforementioned a range parameter of the ROI.

The input that describes the range parameter of each coil can be obtained by accessing a configuration file that includes appropriate configuration descriptions of each available coil that can be used in the MR scanner.

In a preferred embodiment of the present invention, the overlap determination takes place by determining in sequence whether a detection range of each coil overlaps with the range of the ROI; for each coil, the specific determining method comprises any one of the following three forms:

First Form:

Taking a detection range of the coil to be an oriented bounding box OBB, taking the range of the ROI to be an OBB, each of the OBBs having 3 independent faces, and 3 independent edge directions;

with regard to the two OBBs, performing the following detection:

A: detecting whether a first separating axis exists, which separating axis is orthogonal to 3 independent faces of one of the two OBBs;

B: detecting whether a second separating axis exists, which separating axis is orthogonal to 3 independent faces of the other of the two OBBs;

C: combining the total 6 independent edge directions of the two OBBs in pairs, to form 9 edge pair sets, and detecting whether a third separating axis exists, which third separating axis is orthogonal to the 9 edge pair sets;

If the detections A, B and C all hold true, then the two OBBs do not overlap, otherwise the two OBBs overlap;

Second Form:

Taking the range of the ROI and the detection range of the coil element to be AABBs (axis-aligned bounding boxes) respectively, the two AABBs being represented by R and S respectively, then:

If $$(RminX<=SmaxX \char`\^ RmaxX>=SminX)\char`\^$$
$$(RminY<=SmaxY \char`\^ RmaxY>=SminY)A$$
$$(RminZ<=SmaxZ \char`\^ RmaxZ>=SminZ) \text{ holds true,}$$

then R and S overlap;

wherein RminX represents the minimum value of R in the X direction, RmaxX represents the maximum value of R in the X direction, RminY represents the minimum value of R in the Y direction, RmaxY represents the maximum value of R in the Y direction, RminZ represents the minimum value of R in the Z direction, RmaxZ represents the maximum value of R in the Z direction, SminX represents the minimum value of S in the X direction, SmaxX represents the maximum value of S in the X direction, SminY represents the minimum value of S in the Y direction, SmaxY represents the maximum value of S in the Y direction, SminZ represents the minimum value of S in the Z direction, SmaxZ represents the maximum value of S in the Z direction, and A represents an AND relationship;

Third Form:

Taking a detection range of the coil element to be a sphere Q, taking the range of the ROI to be an AABB (P), obtaining a point on the AABB (P) that is closest to the center of the sphere Q, calculating the distance from this point to the center of the sphere Q, and if the distance is smaller than the sphere radius of the sphere Q, then Q and P overlap.

In a preferred embodiment of the present invention, the coil is a coil element set; the detection range of the coil is: the sum of detection ranges of all coil elements in the coil element set; and the step of selecting the coil whose detection range overlaps with the ROI specifically comprises: selecting all coil elements in the coil element set whose detection range overlaps with the range of the ROI;

or the coil is a coil element; the detection range of the coil is the detection range of the coil element; and the step of selecting the coil whose detection range overlaps with the ROI specifically comprises: in a coil element set whose detection range overlaps with the range of the ROI, only selecting a coil element whose detection range overlaps with the range of the ROI.

It can be seen from the technical solution described above that in an embodiment of the present invention, first of all a range parameter of an ROI to be detected is acquired, and a detection range parameter of each coil is acquired; then a coil whose detection range overlaps with a range of the ROI is determined; and finally, the coil whose detection range overlaps with the range of the ROI is selected. MR detection is performed, and finally MRI is performed. Compared with the prior art, in the present invention, coils are selected on the basis of the ROI, not on the basis of the FOV; the selected coil only covers the ROI, so the selection of unnecessary coils is avoided, thereby avoiding unnecessary coil signals; thus the SNR can be increased, and the MRI quality is improved.

DESCRIPTION OF THE PREFERRED EMBODIMENTS

The present invention is explained in further detail below in conjunction with the accompanying drawings and embodiments, to clarify the technical solution and advantages thereof. It should be understood that the particular embodiments described here are merely intended to explain the present invention elaboratively, not to define the scope of protection thereof.

The present invention selects coil elements on the basis of a detection target region (ROI, target region of interest) in an MR system. The ROI is a region in which a part of the body to be examined is located. The ROI may be of any shape. However, in a general embodiment, the ROI is a cuboid. The ROI may be temporarily set by an operator; alternatively, the initial position and shape of the ROI may be preset in the system, and the ROI may then be altered by an operator as required.

Once the ROI has been determined, the system will select a coil; the detection range of the selected coil must overlap with the determined ROI. The term "overlap" as used herein means fully overlapping or partially overlapping.

Figure 1:
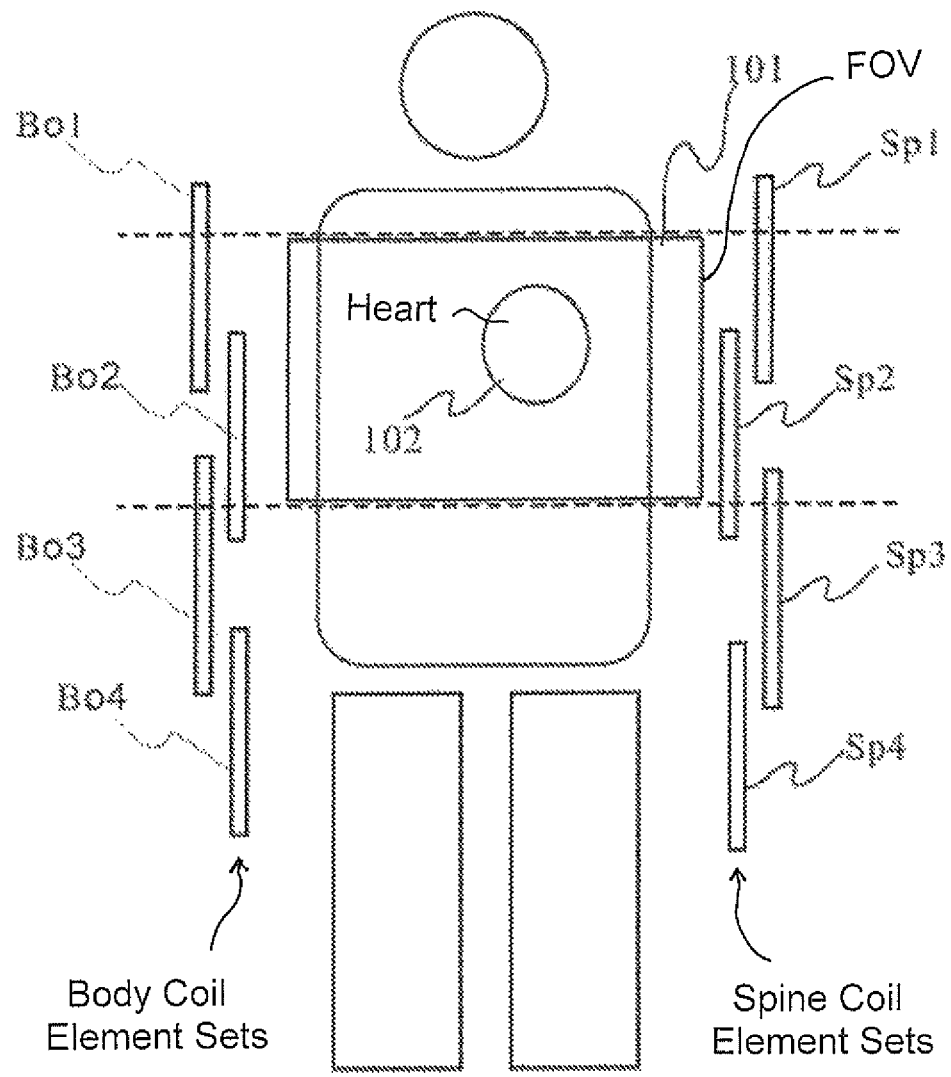
FIG. 1 is a schematic diagram of automatic selection of coils in the prior art.
Figure 2:
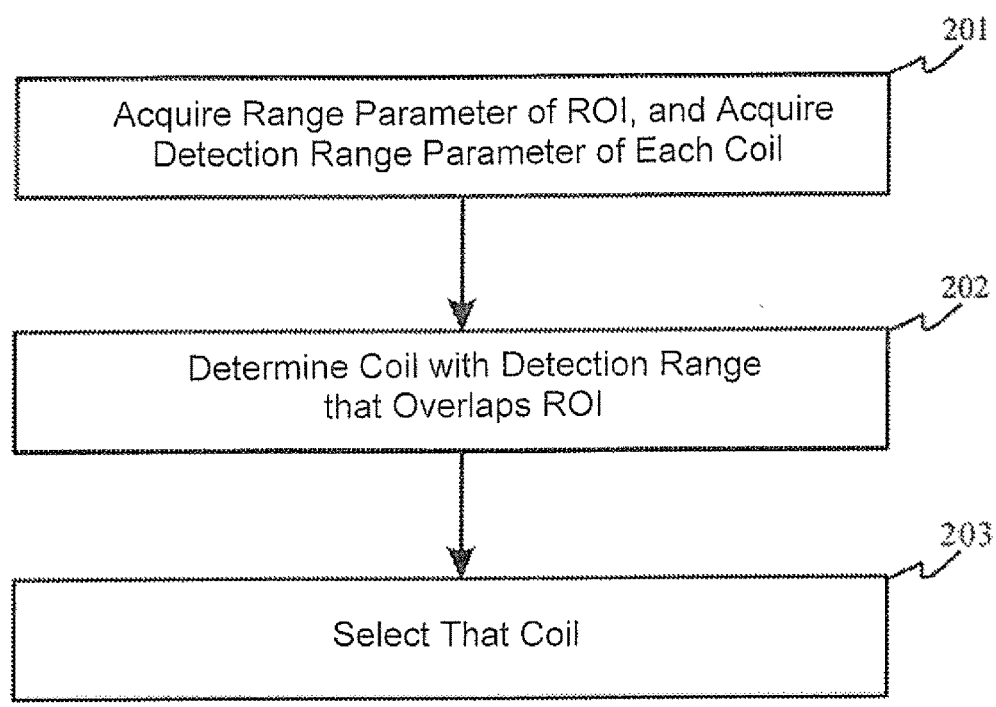
FIG. 2 is a flowchart of the MR coil selection method of the present invention.

In an embodiment of the present invention, an MR coil selection method is proposed. FIG. 2 is a flowchart of the MR coil selection method of the present invention. Referring to FIG. 2, the method mainly comprises:

step 201, acquiring a range parameter of an ROI to be detected, and acquiring a detection range parameter of each coil;

step 202, determining a coil whose detection range overlaps with a range of the ROI;

step 203, selecting the coil whose detection range overlaps with the range of the ROI. MR detection can then be performed.

In the present invention, coils are selected on the basis of the ROI to be detected, not on the basis of the FOV; the selected coil only covers the ROI, so unnecessary signals are avoided; thus the SNR can be increased, thereby improving the MRI quality.

In a particular preferred embodiment, the step of acquiring a range parameter of an ROI may specifically include a manual method and an automatic method.

One type is the manual method. For example, an image of an object to be detected, e.g. an image of the body of a patient to be detected, may be displayed on a user interface (UI) of the MR system, and at the same time, a range selection instruction entered via an input device is received. The input device may for example be a computer mouse, screen writing pen, etc. The operator may use these input devices to draw a target region ROI to be selected on the user interface, e.g. if the patient's heart is being detected, then a region in which the patient's heart is located may be selected as the ROI. Finally, a relative position range of the range selection instruction, in the image of the object to be detected, is determined, and a parameter of this range is taken to be a range parameter of the ROI. For example, the operator could draw a rectangle on the user interface at the patient's heart; then an MR calculation system would automatically calculate a relative position range of an image of the patient to be detected, and take parameters of this range, such as length/width parameters of the rectangle, to be range parameters of the ROI. Of course, if the user interface presents a 3D interface, then a 3D region may be drawn on the user interface; for example, a cuboid may be drawn at the heart, and taken to be an ROI. Then parameters (e.g. length, width and height) of a relative position range of this cuboid, in an image of the patient to be detected, are taken to be range parameters of the ROI.

Another type is the automatic method. For example, a graphical identification algorithm is used to identify the shape of a part to be detected, e.g. the shape of the heart, a bounding box (BB) is generated according to the identified shape, and a parameter of the BB is taken to be a range parameter of the ROI. The BB may be obtained using a principal component analysis (PCA) algorithm.

In a particular preferred embodiment, the step of acquiring a detection range parameter of each coil may specifically comprise: acquisition from a configuration file of a corresponding coil of the MR system. In the MR system, for each coil there is a corresponding configuration file in which basic parameters of that coil are stored, including a detection range parameter of the coil. Generally, the detection range parameter is a geometric parameter, most simply of a cuboid.

In the present invention, a coil in the embodiment shown in FIG. 2 may specifically be a coil element set, i.e. a combination containing two or more coil elements which are capable of forming a coil element set. If a coil in the embodiment shown in FIG. 2 is a coil element set, then the detection range of the coil is: the sum of the detection ranges of all coil elements in the coil element set. If the detection range of any coil element in the coil element set overlaps with the ROI, then the detection range of the coil element set is deemed to overlap with the ROI.

Alternatively, a coil in the embodiment shown in FIG. 2 may also be a coil element; the detection range of the coil is the detection range of the coil element. If the detection range of the coil element overlaps with the ROI, then the detection range of the coil element is deemed to overlap with the ROI.

To determine whether the detection range of a coil element overlaps with the ROI, the present invention proposes the following method of solution.

A preferred method is to use the separating axis theorem: the detection range of the coil element and ROI may be an oriented bounding box (OBB).

A BB algorithm is a method of working out an optimal bounding space for a discrete point set. The basic thinking is to use a geometric body (called a BB) with a slightly larger volume and simple features to approximately replace a complex geometric object. The most common BB algorithms include AABB (axis-aligned bounding box), bounding sphere, oriented bounding box (OBB) and fixed direction hulls (FDH or k-DOP). Amongst these, OBB is a more common BB type. It is any smallest cuboid containing the object and relative to a coordinate axis direction. The greatest characteristic of an OBB is the arbitrary nature of its direction; this enables it to bind an object as tightly as possible according to the shape characteristics of the bounded object. An OBB approaches an object more closely than an AABB or a bounding sphere, and can reduce the number of bounding bodies markedly, thereby avoiding intersection of detection among a large number of bounding bodies.

In a particular preferred embodiment, in step 202, the step of determining a coil whose detection range overlaps with a range of the ROI specifically comprises:

determining in sequence whether a detection range of each coil element overlaps with the range of the ROI; for each coil element, the specific determining method comprises:

taking a detection range of the coil element to be an oriented bounding box (OBB), and taking the ROI range to be an OBB; each OBB has 3 independent face vectors (in fact, an OBB has 6 faces, but these are marked as 3 independent faces because opposing faces considered in pairs are the same, and the face vector means that the faces have a direction), and 3 independent edge directions.

With regard to the two OBBs, the following detection must be performed:

A: detecting whether a first separating axis exists, which separating axis is orthogonal to 3 independent faces of one of the two OBBs;

B: detecting whether a second separating axis exists, which separating axis is orthogonal to 3 independent faces of the other of the two OBBs;

C: combining the total 6 independent edge directions of the two OBBs in pairs, to form 9 edge pair sets, and detecting whether a third separating axis exists, which third separating axis is orthogonal to the 9 edge pair sets;

if the detections A, B and C all hold true, then the two OBBs do not overlap, otherwise the two OBBs overlap.

In another particular preferred embodiment, in the step of determining in sequence whether a detection range of each coil element overlaps with the range of the ROI, for each coil element, another determining method may specifically be used, for example:

Another method of determining whether a detection range of a coil element overlaps with the range of the ROI is as follows: taking the range of the ROI and a detection range of the coil element to be AABBs (axis-aligned bounding boxes) respectively; here, suppose these two AABBs are represented by R and S respectively, and RminX represents the minimum value of R in the X direction, RmaxX represents the maximum value of R in the X direction, RminY represents the minimum value of R in the Y direction, RmaxY represents the maximum value of R in the Y direction, RminZ represents the minimum value of R in the Z direction, RmaxZ represents the maximum value of R in the Z direction, SminX represents the minimum value of S in the X direction, SmaxX represents the maximum value of S in the X direction, SminY represents the minimum value of S in the Y direction, SmaxY represents the maximum value of S in the Y direction, SminZ represents the minimum value of S in the Z direction, SmaxZ represents the maximum value of S in the Z direction, and A represents an AND relationship. Then:

if $(RminX <= SmaxX \; RmaxX >= SminX)\hat{\;}$
$(RminY <= SmaxY \; RmaxY >= SminY)A$
$(RminZ <= SmaxZ \; RmaxZ >= SminZ)$ holds true,
then $R$ and $S$ overlap.

Another method of determining whether a detection range of a coil element overlaps with the range of the ROI is as follows:

taking a detection range of the coil element to be a sphere Q, and taking the range of the ROI to be an AABB; supposing the AABB is P, then a point on P that is closest to the center of the sphere Q is obtained, the distance from this point to the center of the sphere Q is calculated, and if the distance is smaller than the sphere radius of the sphere Q, then Q and P overlap.

Figure 3:
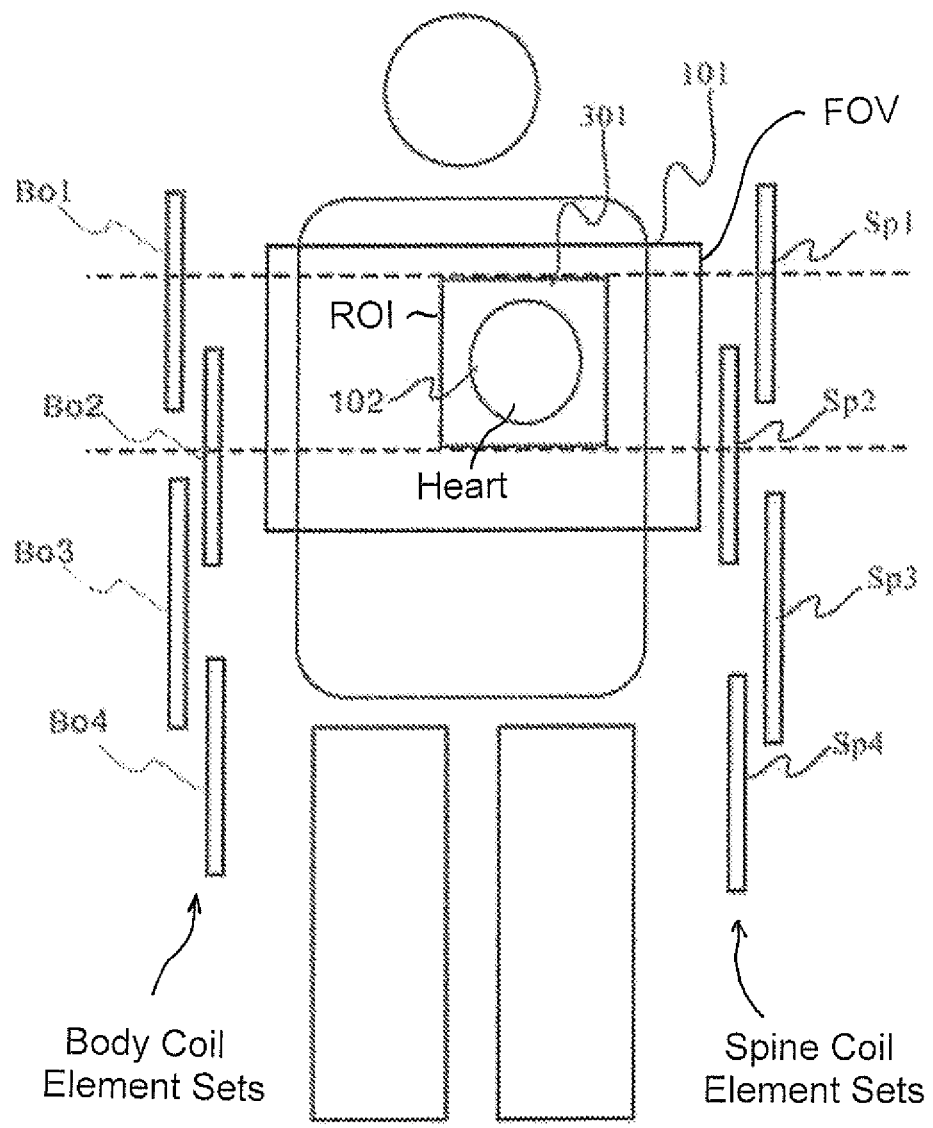
FIG. 3 shows a schematic diagram of coil selection in the method of the present invention.

FIG. 3 shows a schematic diagram of coil selection in the method of the present invention. Referring to FIG. 3, suppose that the current ROI 301 is a region in which the heart 102 is located. Based on ROI 301, coil elements sets Bo1, Bo2, Sp1 and Sp2 overlap with the ROI 301, therefore coil element sets Bo1, Bo2, Sp1 and Sp2 are selected. In the system of some embodiments, all the coil elements in a coil element set must be selected; such coil elements are called matrix coils. In such an embodiment, all coil elements in Bo1, Bo2, Sp1 and Sp2 are selected.

Figure 4:
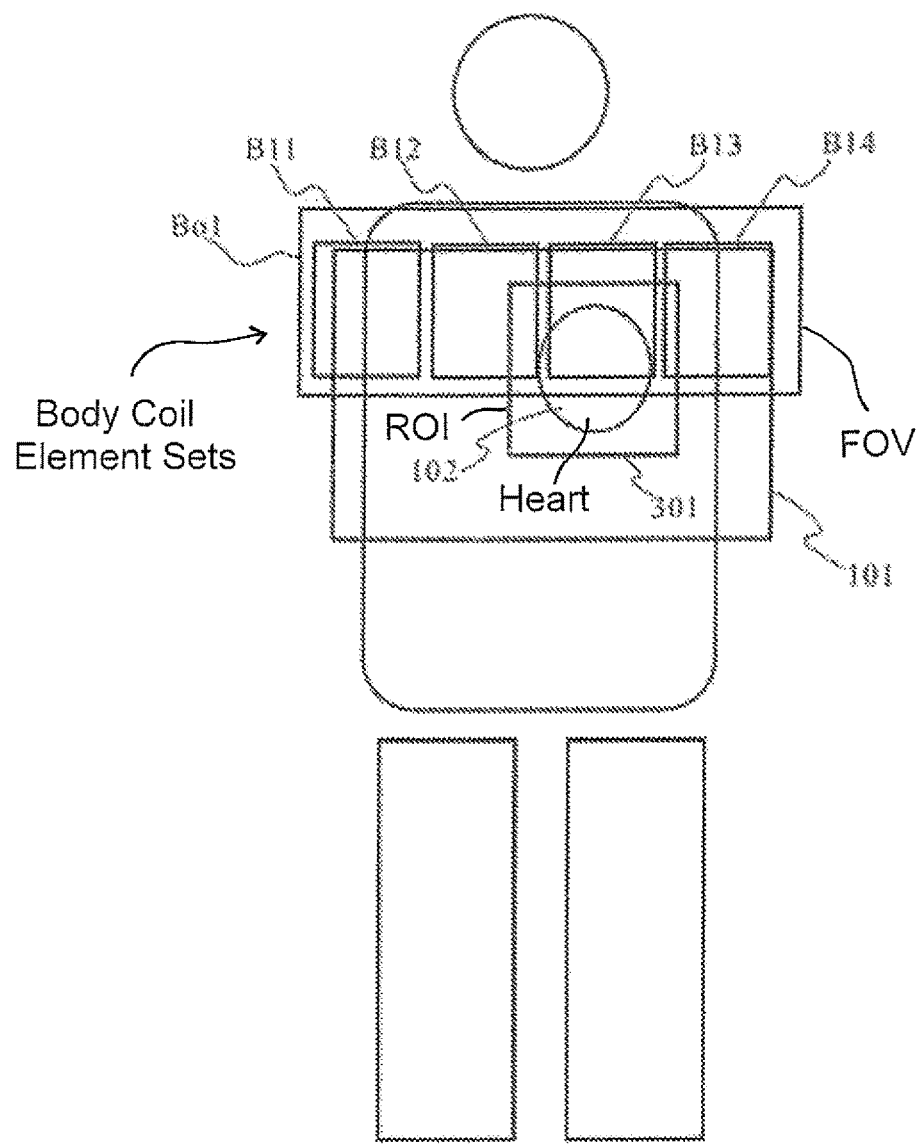
FIG. 4 shows a schematic diagram of array coil selection.

However, there is another type of coil element, called an array coil, i.e. coil elements in a coil element set may be selected independently. FIG. 4 shows a schematic diagram of array coil selection. Referring to FIG. 4, an example of selecting one or more coil elements from a coil element set is given. Suppose that coil element set Bo1 comprises coil elements B11, B12, B13 and B14, and in the coil element set Bo1, the detection range of coil element B11 does not overlap with the ROI, while the detection ranges of coil elements B12, B13 and B14 overlap with the ROI 301; then coil elements B12, B13 and B14 will be selected, but coil element B11 will not be selected.

Figure 5:
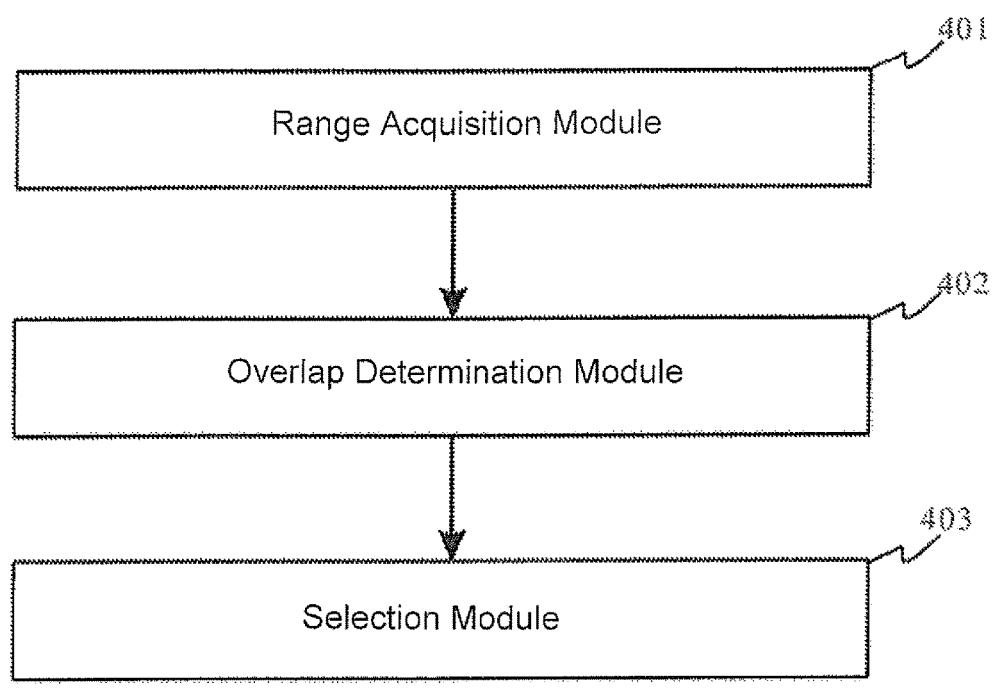
FIG. 5 is a schematic diagram of the composition of the MR coil selection apparatus of the present invention.

Corresponding to the method described above, the present invention also discloses an MR coil selection apparatus, which may be used to execute any embodiment of the MR coil selection method described above. FIG. 5 is a schematic diagram of the composition of the MR coil selection apparatus of the present invention; referring to FIG. 5, the MR coil selection apparatus principally comprises:

a range acquisition module 401, for acquiring a range parameter of an ROI to be detected, and acquiring a detection range parameter of each coil;

an overlap determination module 402, for determining a coil whose detection range overlaps with a range of the ROI;

a selection module 403, for selecting the coil whose detection range overlaps with the range of the ROI.

The selected coil may then be used to perform MR detection.

In a preferred embodiment of the MR coil selection apparatus, the range acquisition module 401 is specifically used for:

acquiring a range parameter of an ROI, specifically: displaying an image of an object to be detected on a user interface of an MR system, receiving a range selection instruction inputted by an input device, determining a relative position range, in the image of the object to be detected, of the range selection instruction, and taking a parameter of the range to be a range parameter of the ROI; or using a graphical identification algorithm to identify the shape of an object to be detected, generating a bounding box (BB) according to the identified shape, and taking a parameter of the BB to be a range parameter of the ROI;

the step of acquiring a detection range parameter of each coil by the range acquisition module 401 is specifically: acquisition from a configuration file of a corresponding coil of the MR system.

In a preferred embodiment of the MR coil selection apparatus, the overlap determination module 402 is specifically used for:

determining in sequence whether a detection range of each coil overlaps with the range of the ROI; for each coil, the specific determining method comprises:

taking the detection range of the coil to be an oriented bounding box (OBB), taking the range of the ROI to be an OBB, and determining whether a separating axis exists; if the separating axis is perpendicular to 3 faces of one of the OBBs, to 3 faces of the other OBB, and to 9 pairs of edges, then the two OBBs do not overlap, otherwise the two OBBs overlap.

In another preferred embodiment of the MR coil selection apparatus, the coil is a coil element set; the detection range of the coil is: the sum of detection ranges of all coil elements in the coil element set; and the step of selecting the coil whose detection range overlaps with the ROI specifically comprises: selecting all coil elements in the coil element set whose detection range overlaps with the range of the ROI;

or the coil is a coil element; the detection range of the coil is the detection range of the coil element; and the step of selecting the coil whose detection range overlaps with the ROI specifically comprises: in a coil element set whose detection range overlaps with the range of the ROI, only selecting a coil element whose detection range overlaps with the range of the ROI.

Compared with the prior art, in the present invention, coils are selected on the basis of the ROI, not on the basis of the FOV; the selected coil only covers the ROI, so unnecessary coil signals are avoided; thus the SNR can be increased, and the MRI quality is improved.

In addition, each functional module in the various embodiments of the present invention may be integrated in a processing unit, or each module may physically exist independently, or two or more modules may be integrated in one unit. The integrated unit described above may not only be implemented in the form of hardware, but may also be implemented in the form of a software functional unit. The functional modules in each embodiment described may be located in one terminal or network node, or be distributed on multiple terminals or network nodes.

Furthermore, each embodiment of the present invention may be implemented by means of a data processing program executed by a data processing device such as a computer. Clearly, the data processing program forms the present invention. Furthermore, a data processing program stored in a storage medium is generally executed by reading the program directly from the storage medium or by installing or copying the program onto a storage device (e.g. hard disk and/or internal memory) of a data processing device. Therefore, such a storage medium also forms the present invention. The storage medium may use any type of recording method, e.g. a paper storage medium (such as a paper tape), a magnetic storage medium (such as a floppy disk, hard disk, internal memory), an optical storage medium (such as a CD-ROM), a magneto-optical storage medium (such as MO), etc.

Thus, the present invention also discloses a storage medium, in which a data processing program is stored, wherein the data processing program is used to execute any embodiment of the abovementioned method of the present invention.

Furthermore, the method steps of the present invention may not only be implemented using a data processing program, but may also be implemented by hardware, e.g. by logic gates, switches, dedicated integrated circuits (ASICs), programmable logic controllers and embedded microcontrollers, etc. Thus, such hardware, which is capable of implementing the method of the present invention, may also form the present invention.

The embodiments above are merely preferred embodiments of the present invention, which are not intended to limit it. Any amendments, equivalent substitutions or improvements etc. made within the spirit and principles of the present invention shall be included in the scope of protection thereof.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) coil selection method, comprising:
   providing a computer with a range parameter that is associated with a size of a target region ROI to be detected by operation of an MR data acquisition scanner, and in said computer, acquiring a detection range parameter of each coil that is available for use in the MR scanner;
   in said computer, determining a coil that has a detection range that overlaps with a range of the ROI by:
   taking a detection range of the coil to be an oriented bounding box OBB, taking the range of the ROI to be an OBB, each of the OBBs having 3 independent faces, and 3 independent edge directions;
   with regard to the two OBBs, performing the following detection:
   A: detecting whether a first separating axis exists, which separating axis is orthogonal to 3 independent faces of one of the two OBBs;
   B: detecting whether a second separating axis exists, which separating axis is orthogonal to 3 independent faces of the other of the two OBBs;
   C: combining the total 6 independent edge directions of the two OBBs in pairs, to form 9 edge pair sets, and detecting whether a third separating axis exists, which third separating axis is orthogonal to the 9 edge pair sets; and
   if the detections A, B and C all hold true, then the two OBBs do not overlap, otherwise the two OBBs overlap; and
   selecting the coil having a detection range that overlaps with the range of the ROI for use in said MR scanner in order to acquire MR data from said target region ROI.

2. The method as claimed in claim 1, comprising providing the range parameter of the ROI to said computer by:
   displaying an image of an object to be detected on a user interface of the MR scanner, receiving a range selection instruction entered into the computer by an input device, determining a relative position range, in the image of the object to be detected, of the range selection instruction, and taking a parameter of the range to be a range parameter of the ROI, or using a graphical identification algorithm to identify the shape of a part to be detected, generating a bounding box according to the identified shape, and taking a parameter of the bounding box to be a range parameter of the ROI.

3. The method as claimed in claim 1, comprising acquiring the detection range parameter of each coil by accessing a configuration file of said available coils of the MR scanner.

4. A magnetic resonance (MR) coil selection method comprising:
   providing a computer with a range parameter that is associated with a size of a target region ROI to be detected by operation of an MR data acquisition scanner, and in said computer, acquiring a detection range parameter of each coil that is available for use in the MR scanner;
   determining a coil having a detection range that overlaps with a range of the ROI by:
   taking the range of the ROI and the detection range of the coil element to be AABBs (axis-aligned bounding boxes) respectively, the two AABBs being represented by R and S respectively; and if $(RminX<=SmaxX \wedge RmaxX>=SminX) \wedge$
   $(RminY<=SmaxY \wedge RmaxY>=SminY) \wedge$
   $(RminZ<=SmaxZ \wedge RmaxZ>=SminZ)$ holds true,
   then R and S overlap, wherein RminX represents the minimum value of R in the X direction, RmaxX represents the maximum value of R in the X direction, RminY represents the minimum value of R in the Y direction, RmaxY represents the maximum value of R in the Y direction, RminZ represents the minimum value of R in the Z direction, RmaxZ represents the maximum value of R in the Z direction, SminX represents the minimum value of S in the X direction, SmaxX represents the maximum value of S in the X direction, SminY represents the minimum value of S in the Y direction, SmaxY represents the maximum value of S in the Y direction, SminZ represents the minimum value of S in the Z direction, SmaxZ represents the maximum value of S in the Z direction, and A represents an AND relationship; and
   selecting the coil having a detection range that overlaps with the range of the ROI for use in said MR scanner in order to acquire MR data from said target region ROI.

5. A magnetic resonance (MR) coil selection method comprising:
   providing a computer with a range parameter that is associated with a size of a target region ROI to be detected by operation of an MR data acquisition scanner, and in said computer, acquiring a detection range parameter of each coil that is available for use in the MR scanner;
   determining a coil having a detection range that overlaps with a range of the ROI specifically by:
   taking a detection range of the coil element to be a sphere Q, taking the range of the ROI to be an axis-aligned bounding box AABB, obtaining a point P on the AABB that is closest to the center of the sphere Q, calculating the distance from this point to the center of the sphere Q, and if the distance is smaller than the sphere radius of the sphere Q, then Q and P overlap; and
   selecting the coil having a detection range that overlaps with the range of the ROI for use in said MR scanner in order to acquire MR data from said target region ROI.

6. The method as claimed in claim 1 wherein the available coil is a coil element set, the detection range of the coil is the sum of detection ranges of all coil elements in the coil element set, and selecting the coil having a detection range that overlaps with the ROI comprises selecting all coil elements in the coil element set whose detection range overlaps with the range of the ROI.

7. The method as claimed in claim 1 wherein the available coils are coil elements, the detection range of the coil is the detection range of the coil element, and selecting the coil having a detection range that overlaps with the ROI comprises, in a coil element set whose detection range overlaps with the range of the ROI, only selecting a coil element whose detection range overlaps with the range of the ROI.

8. A computer for selecting a magnetic resonance (MR) coil, said computer comprising:
   an input interface that receives a range parameter that is associated with a size of a target region ROI to be detected by operation of an MR data acquisition scanner, and in said computer, acquiring a detection range parameter of each coil that is available for use in the MR scanner;

a processor configured to determine a coil that has a detection range that overlaps with a range of the ROI by:

taking a detection range of the coil to be an oriented bounding box OBB, taking the range of the ROI to be an OBB, each of the OBBs having 3 independent faces, and 3 independent edge directions;

with regard to the two OBBs, performing the following detection:

A: detecting whether a first separating axis exists, which separating axis is orthogonal to 3 independent faces of one of the two OBBs;

B: detecting whether a second separating axis exists, which separating axis is orthogonal to 3 independent faces of the other of the two OBBs;

C: combining the total 6 independent edge directions of the two OBBs in pairs, to form 9 edge pair sets, and detecting whether a third separating axis exists, which third separating axis is orthogonal to the 9 edge pair sets; and if the detections A, B and C all hold true, then the two OBBs do not overlap, otherwise the two OBBs overlap;

an output interface; and said processor being configured to produce a designation at said output interface of the coil having a detection range that overlaps with the range of the ROI for use in said MR scanner in order to select that coil to acquire MR data from said target region ROI.

9. The computer as claimed in claim 8, comprising receiving the range parameter of the ROI to said computer by:

displaying an image of an object to be detected on a user interface of the MR scanner, receiving a range selection instruction entered into the computer by an input device, determining a relative position range, in the image of the object to be detected, of the range selection instruction, and taking a parameter of the range to be a range parameter of the ROI, or using a graphical identification algorithm to identify the shape of a part to be detected, generating a bounding box according to the identified shape, and taking a parameter of the bounding box to be a range parameter of the ROI.

10. The computer as claimed in claim 8, comprising wherein the processor is configured to acquire the detection range parameter of each coil by accessing a configuration file of said available coils of the MR scanner.

11. A computer for selecting a magnetic resonance (MR) coil, comprising:

an input interface that receives a range parameter that is associated with a size of a target region ROI to be detected by operation of an MR data acquisition scanner, and in said computer, acquiring a detection range parameter of each coil that is available for use in the MR scanner;

a processor configured to determine a coil having a detection range that overlaps with a range of the ROI by:

taking the range of the ROI and the detection range of the coil element to be AABBs (axis-aligned bounding boxes) respectively, the two AABBs being represented by R and S respectively; and if $(RminX<=SmaxX \char`\^ RmaxX>=SminX) \char`\^$
$(RminY<=SmaxY \char`\^ RmaxY>=SminY) \char`\^$
$(RminZ<=SmaxZ \char`\^ RmaxZ>=SminZ)$ holds true, then $R$ and $S$ overlap, wherein RminX represents the minimum value of R in the X direction, RmaxX represents the maximum value of R in the X direction, RminY represents the minimum value of R in the Y direction, RmaxY represents the maximum value of R in the Y direction, RminZ represents the minimum value of R in the Z direction, RmaxZ represents the maximum value of R in the Z direction, SminX represents the minimum value of S in the X direction, SmaxX represents the maximum value of S in the X direction, SminY represents the minimum value of S in the Y direction, SmaxY represents the maximum value of S in the Y direction, SminZ represents the minimum value of S in the Z direction, SmaxZ represents the maximum value of S in the Z direction, and A represents an AND relationship; and an output interface; and said processor being configured to produce a designation at said output interface of the coil having a detection range that overlaps with the range of the ROI for use in said MR scanner in order to select that coil to acquire MR data from said target region ROI.

12. A computer for selecting a magnetic resonance (MR) coil, comprising:

an input interface that receives a range parameter that is associated with a size of a target region ROI to be detected by operation of an MR data acquisition scanner, and in said computer, acquiring a detection range parameter of each coil that is available for use in the MR scanner;

a processor configured to determine a coil having a detection range that overlaps with a range of the ROI by:

taking a detection range of the coil element to be a sphere Q, taking the range of the ROI to be an axis-aligned bounding box AABB, obtaining a point P on the AABB that is closest to the center of the sphere Q, calculating the distance from this point to the center of the sphere Q, and if the distance is smaller than the sphere radius of the sphere Q, then Q and P overlap; and an output interface; and said processor being configured to produce a designation at said output interface of the coil having a detection range that overlaps with the range of the ROI for use in said MR scanner in order to select that coil to acquire MR data from said target region ROI.

13. The computer as claimed in claim 8 wherein the available coil is a coil element set, the detection range of the coil is the sum of detection ranges of all coil elements in the coil element set, and wherein the processor is configured to select the coil having a detection range that overlaps with the ROI by selecting all coil elements in the coil element set whose detection range overlaps with the range of the ROI.

14. The computer as claimed in claim 8 wherein the available coils are coil elements, the detection range of the coil is the detection range of the coil element, and wherein the processor is configured to select the coil having a detection range that overlaps with the ROI by, in a coil element set whose detection range overlaps with the range of the ROI, only selecting a coil element whose detection range overlaps with the range of the ROI.

\* \* \* \* \*